(12) United States Patent
Guenther et al.

(10) Patent No.: US 8,207,500 B2
(45) Date of Patent: Jun. 26, 2012

(54) MICROMECHANICAL SENSOR HAVING A VARIABLE CAPACITOR AND METHOD FOR DETECTING ELECTROMAGNETIC RADIATION USING SAME

(75) Inventors: Sebastian Guenther, Tuebingen (DE); Nicolaus Ulbrich, Gomaringen (DE); Volker Materna, Eisenach (DE)

(73) Assignee: Robert Bosch GmbH, Stuttgart (DE)

( * ) Notice: Subject to any disclaimer, the term of this patent is extended or adjusted under 35 U.S.C. 154(b) by 322 days.

(21) Appl. No.: 12/620,301

(22) Filed: Nov. 17, 2009

(65) Prior Publication Data

US 2010/0127175 A1 May 27, 2010

(30) Foreign Application Priority Data

Nov. 17, 2008 (DE) .......................... 10 2008 043 797

(51) Int. Cl.
*G01J 5/00* (2006.01)
(52) U.S. Cl. ..................................... 250/338.1; 250/340
(58) Field of Classification Search ............... 250/338.1, 250/340
See application file for complete search history.

(56) References Cited

U.S. PATENT DOCUMENTS 7,145,143 B2 * 12/2006 Wood et al. .............. 250/339.04
7,495,199 B2 *  2/2009 Jankowiak .................... 250/200
* cited by examiner

*Primary Examiner* — David Porta
*Assistant Examiner* — Hugh H Maupin
(74) *Attorney, Agent, or Firm* — Kenyon & Kenyon LLP

(57) ABSTRACT

A sensor for detecting electromagnetic radiation, having a detection element; and at least one electrode; the detection element and the at least one electrode forming a variable capacitor, and a change in the capacitance of the capacitor being caused by the detected electromagnetic radiation.

10 Claims, 1 Drawing Sheet

MICROMECHANICAL SENSOR HAVING A VARIABLE CAPACITOR AND METHOD FOR DETECTING ELECTROMAGNETIC RADIATION USING SAME

BACKGROUND INFORMATION

Sensors, so-called thermo elements, with whose aid temperatures, among other things, can be measured are already known. Known thermo elements are made up of two materials, which have different characteristics and are connected to each other. These different materials generate between their open ends a voltage that is a function of the temperature differential. Thermo elements do not measure the absolute temperature but generate an output voltage which corresponds to a temperature difference or a temperature gradient between contact point and open end. This voltage (Seebeck voltage) is caused by the so-called Seebeck effect.

The described electrical Seebeck voltage is produced by thermo diffusion flows. A specific temperature means that the thermal energy stored in the material is distributed to the kinetic energy of the electrons and the vibrational energy of the atomic cores. In this case the ratio is a constant that is typical for the individual material. The electrons consequently have higher kinetic energy at the hot end than the electrons at the cold end of the conductor. The greater kinetic energy then causes the "hot" electrons to distribute more heavily in the conductor than the "cold" electrons. The result is a disequilibrium because the electron density increases at the cold end and decreases at the hot end. This happens for precisely the length of time it takes for the electric field generated by this disequilibrium to ensure that a state of equilibrium which counteracts the thermo-diffusion of the "hot" electrons comes about. The generated voltage $U_{seebeck}$ is defined by:

$$U_{seebeck} = \alpha \cdot \Delta T$$

with $\Delta T$ being the temperature differential between the conductor ends and $\alpha$ the Seebeck coefficient.

If a plurality of thermo elements is connected to each other by a series connection, then a thermopile is produced. This thermopile generates a higher voltage than an individual element depending on the number of interconnected thermo elements. Thermopiles are frequently used as infrared radiation detectors.

However, these known thermo elements have the disadvantage that the desired effect and additional parameters depend on the selected material pairing.

SUMMARY OF THE INVENTION

The method according to the present invention advantageously includes a sensor for detecting electromagnetic radiation having a detection element and at least one electrode, the detection element and the at least one electrode forming a variable capacitor, and a change in capacitor's capacitance being caused by the detected electromagnetic radiation.

In the device according to the present invention it is possible to selectively vary characteristics such as the sensitivity of thermo elements, and thus of thermopiles as well, even during operation.

Furthermore, it is possible to dispense with the technologically complex use of material pairings because in the device according to the present invention the Seebeck effect of an individual material is made measurable.

The device according to the present invention does not measure an electrical potential difference, but the change in the capacitance of a variable capacitor. To this end use is made of a capacitive distance sensor made up of the detection element and the at least one electrode, which converts the occurring potential differences due to the electrostatic attractive force into a change in the clearance between the capacitor plates, and thus into a change in capacitance between the capacitor plates.

This dispenses with the need to use a suitable material pairing. Furthermore, no second electric conductor has to be brought into the vicinity of the rocker element for the capacitive evaluation of the deflection of the sensor structure. As a consequence, there is no need here to consider possible measuring effects. Furthermore, to avoid measuring effects, it is not necessary to use materials having the same Seebeck coefficient. This results in a structurally simplified configuration of the device.

In other words, the device according to the present invention is a variable capacitor in which one capacitor plate is formed by the rocker element, and the other capacitor plate by an electrode at the temperature level of the silicon substrate. The rocker element has one or no seismic mass. The Seebeck voltage generated in the rocker element causes the rocker element to be deflected into a preferred direction. This deflection leads to a change in the clearance between the capacitor plates. This change in clearance results in a change of the capacitor's capacitance. The deflection and the capacitance change it produces are directly proportional to the generated Seebeck voltage.

According to the present invention, the electromagnetic radiation may be ultraviolet radiation having a wavelength in a range from 1 nm to 380 nm, visible light having a wavelength in a range from 380 nm to 780 nm and/or infrared radiation having a wavelength in a range from 780 nm to 1000 nm.

The device according to the present invention may be used as $CO_2$ sensor, as breath sensor, preferably for measuring the alcohol concentration of the breath, and/or as temperature sensor, preferably for detecting the temperature of windshields.

The sensitivity of the thermo element is variable during active operation by electrostatic predeflection. The electrostatic predeflection may be implemented such that it lies close to the snap point of the sensor structure. Any further increase in the electric voltage by electromagnetic radiation then leads to triggering of the sensor structure and thus to a high change in capacitance. Very sensitive switches which react to electromagnetic radiation are able to be realized in this way.

The mechanical design of the device allows the realization of a mechanical low-pass filter. The low-pass filter filters the resistance noise and thereby improves the signal-to-noise ratio in comparison with known systems.

To protect the sensor structure, it may be packaged in hermetically sealed manner. For example, an undoped silicon structure may be applied above the rocker element for this purpose and connected to the sensor structure in hermetically sealed manner. The structure should have sufficient transparency for the electromagnetic radiation to be detected.

Suitable cyclical clocking of the electrodes makes it possible to achieve an average predeflection of the rocker element, by which the sensitivity may be increased substantially; furthermore, an occurring non-linearity close to the pull-in point (snap point) is able to be utilized.

In addition, a fixed predeflection of the rocker may be achieved by suitable patterning of the first electrode and by connecting the rocker to a different electrical potential than the silicon substrate. In this case the first electrode must be connected to the rocker in an electrically conductive manner.

DETAILED DESCRIPTION

Figure 1:
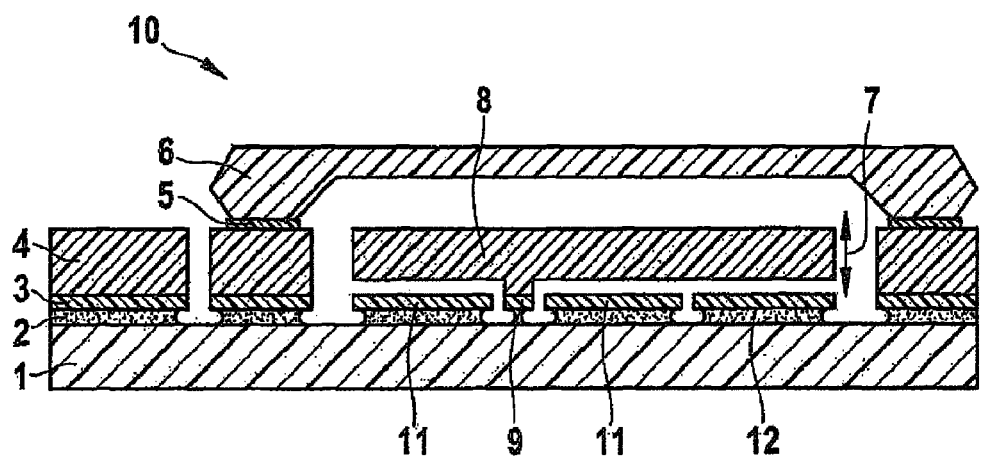
FIG. 1 shows a schematic illustration of a sensor according to the present invention.

FIG. 1 schematically illustrates the design of a sensor. An oxide layer 2 is applied on a silicon substrate 1. A silicon layer 3 is in turn applied on oxide layer 2. Using suitable exposure and etching processes, a spring element 9 and electrodes 11, 12 are produced with the aid of oxide layer 2 and silicon layer 3. A rocker element 8 is elastically connected to silicon substrate 1 via spring element 9. Direction of sensing 7 of the sensor may essentially be in the direction of the normal vector of silicon substrate 1. Situated on opposite-lying sides of spring element 9 are separate evaluation electrodes 11 on silicon substrate 1. Rocker element 8 may be produced from epitaxial polysilicon. The sensor may be covered by a cap 6 made of silicon. The cap is connectable to the mechanical structure of epitaxial polysilicon via seal glass. It is also possible to use the sensor without cover.

The design of the sensor described here is such that infrared radiation strikes a suitably doped silicon rocker element 8, is largely absorbed there and thus induces a temperature increase in rocker element 8 relative to silicon layer (VP electrode) 3 lying underneath relative to the IR beam path. This VP electrode 3 is at the same temperature level as heat sink (silicon substrate) 1. The temperature differential within the silicon semiconductor causes a voltage differential, which linearly correlates with the temperature differential via the Seebeck coefficient.

The direct detection of this variable by measuring technology is difficult because tapping of this voltage at the points in the measuring conductor having different temperatures would likewise result in the Seebeck effect and compensate if materials of the same type were used. Therefore, in the invention described here, no electric conductor for tapping the potential difference is mounted on rocker element 8, but instead the effect of this potential difference is measured.

The sensor converts this potential difference due to electrostatic attraction into a changed capacitance: the larger the incident IR radiation 25, the greater the temperature differential between rocker element 8 and substrate 1 lying underneath and acting as heat sink, or electrodes 11, 12 applied on substrate 1. The causal loop is as follows: The larger the temperature differential, the larger the potential difference between rocker element 8 and VP electrode 3 caused by the Seebeck effect. The larger this potential difference, the larger the force of attraction between rocker element 8 and VP electrode 3. The larger the force of attraction between rocker element 8 and substrate 1, the smaller the gap between rocker element 8 and substrate 1, which comes about as state of equilibrium between the electrostatic force of attraction and the restoring spring force of rocker element 8. The smaller this clearance becomes, the larger the capacitance of the sensor. This change in capacitance may be read out via an application-specific integrated circuit (ASIC) 24, for instance, and be supplied as an electrical signal.

Figure 2:
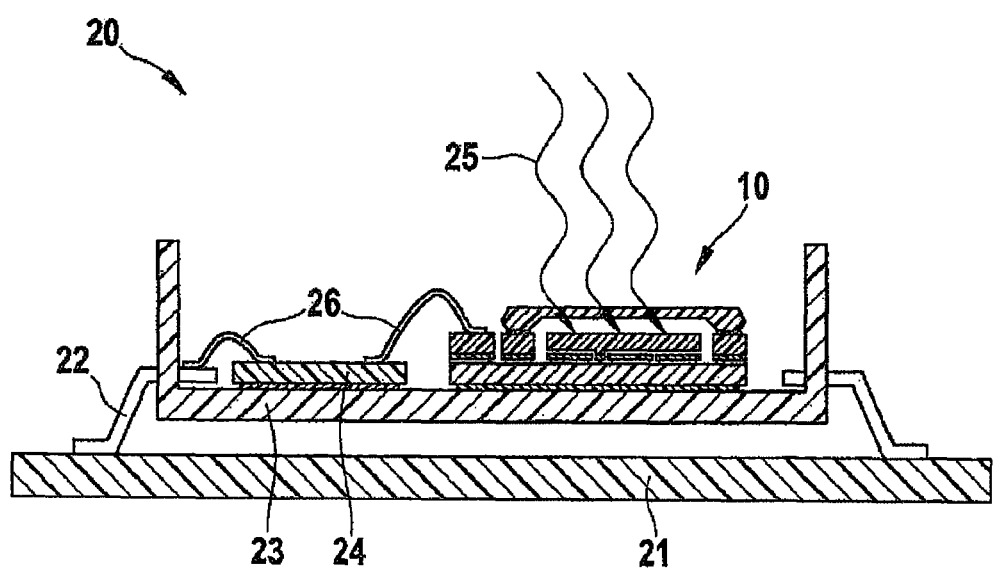
FIG. 2 shows a schematic illustration of an electronic component.

FIG. 2 shows an electronic component 20. Component 20 is made up of a sensor housing 23 in which an ASIC 24 and sensor 10 are situated. ASIC 24 and sensor 10 are electrically interconnected with the aid of bonds 26. In addition, sensor housing 23 has housing pins 22, some of which are electrically connected by bonds 26 to ASIC 24. Sensor housing 23 may be fixed in place on a circuit board 21 and electrically contacted with the aid of housing pins 22. Denoted by 25 is the electromagnetic radiation that impinges on sensor 10.

A method and a device for determining an electromagnetic radiation, in particular infrared radiation, using a detection element and at least one electrode were described, the detection element and the at least one electrode forming a variable capacitor, and a change in capacitance of the capacitor being caused by the detected electromagnetic radiation.

While preferred and exemplary developments were shown and described, it is clear from the preceding text that various modifications may be made without departing from the basic idea of the present invention. Accordingly, the present invention is not to be restricted to the preferred and exemplary embodiments by their detailed description.

What is claimed is:

1. A sensor for detecting electromagnetic radiation, comprising:
   a detection element; and
   at least one electrode,
   wherein the detection element and the at least one electrode form a variable capacitor, and the detected electromagnetic radiation causes a change in a capacitance of the capacitor.

2. The sensor according to claim 1, wherein the detection element includes a rocker element and a spring element, and the rocker element is deflectable about the spring element.

3. The sensor according to claim 2, wherein the at least one electrode is situated between the rocker element and a carrier substrate.

4. The sensor according to claim 2, wherein a deflection of the rocker element is variable by controlling the at least one electrode.

5. The sensor according to claim 1, wherein a hermetically sealed protective layer is applied on the sensor.

6. The sensor according to claim 5, wherein the protective layer is made up of an undoped silicon structure.

7. The sensor according to claim 2, wherein the rocker element and the spring element form a low-pass filter.

8. The sensor according to claim 2, wherein the deflection of the rocker element is set by control of the electrode.

9. The sensor according to claim 1, further comprising an integrated switching circuit for evaluating output signals.

10. A method for detecting electromagnetic radiation, comprising:
    forming a variable capacitor with a detection element and at least one electrode, the detected electromagnetic radiation causing a change in a capacitance of the capacitor.

* * * * *